United States Patent [19]

Murai et al.

[11] Patent Number: 4,866,717

[45] Date of Patent: Sep. 12, 1989

[54] CODE ERROR DETECTING AND CORRECTING APPARATUS

[75] Inventors: Katsumi Murai, Kyoto; Makoto Usui, Suita; Isao Satoh, Neyagawa, all of Japan

[73] Assignee: Matsushita Electric Industrial Co., Ltd., Osaka, Japan

[21] Appl. No.: 77,608

[22] Filed: Jul. 24, 1987

[30] Foreign Application Priority Data

Jul. 29, 1986 [JP] Japan ............................. 61-178021
Jun. 30, 1987 [JP] Japan ............................. 62-162762

[51] Int. Cl.⁴ .............................................. G06F 11/10
[52] U.S. Cl. ................................... 371/40.3; 371/40.2
[58] Field of Search ............... 371/38, 2, 13; 365/200; 364/200 MS File, 900 MS File; 360/38.1, 53, 45

[56] References Cited

U.S. PATENT DOCUMENTS

| | | | |
|---|---|---|---|
| 4,637,023 | 1/1987 | Lounsbury | 371/13 X |
| 4,646,304 | 2/1987 | Fossati | 371/13 X |
| 4,672,613 | 6/1987 | Foxworthy | 371/38 |

Primary Examiner—Jerry Smith
Assistant Examiner—Robert W. Beausoliel
Attorney, Agent, or Firm—Stevens, Davis, Miller & Mosher

[57] ABSTRACT

An error detecting and correcting apparatus to detect and correct errors in code words to be subjected to a digital recording and reproducing operations by use of a recording medium. The apparatus is characterized by an interface method with respect to the host computer which generates digital information to be written on a recording medium or which utilizes the digital information read from the recording medium. The host computer supplies address data to a buffer memory circuit controlled by the error detecting and correcting apparatus through an address bus and a data bus connected between the host computer and the error detecting and correcting apparatus, thereby effecting input/output operations of digital data, namely, information codes. To this end, according to the apparatus of the present invention, only the information symbols necessary on the host computer side are allocated to a consecutive space of the buffer memory and the control codes and check symbols are controlled and are stored such that the information symbols are located in particular addresses of the buffer memory space.

6 Claims, 8 Drawing Sheets

CODE ERROR DETECTING AND CORRECTING APPARATUS

BACKGROUND OF THE INVENTION

1. Field of the Invention

The present invention relates to a code error detecting and correcting apparatus for a system using with an optical disk to record and/or reproduce data.

2. Description of the Related Art

Figure 6:
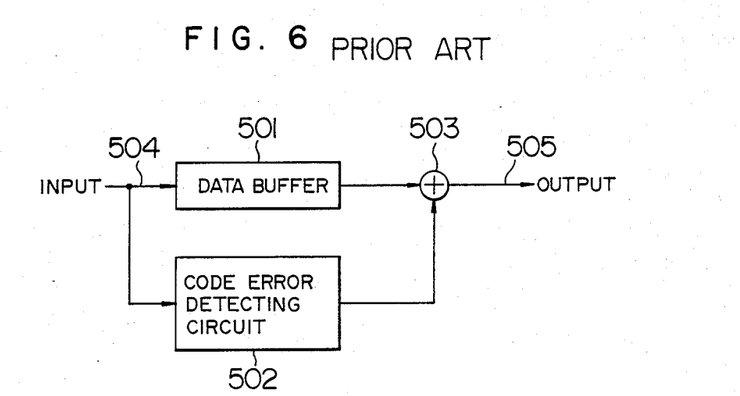
FIG. 6 is a schematic block diagram depicting a conventional code error detecting and correcting apparatus.

Recently, a data record/reproduce system using an optical disk as a recording medium has been intensively developed. Although an optical disk memory enables the storage of a large amount of data compared with a magnetic disk, the error ratio of the recording media itself is inherently higher. This disadvantage therefore is covered by adding an error detecting and correcting code to the data, both the data and the error correcting and detecting code should be recorded, on the optical disk. Furthermore, a common method of reproduction detects and corrects an error of data by use of the error detecting and correcting code. FIG. 6 is a schematic diagram showing the conventional error detecting and correcting apparatus. The system of FIG. 6 includes a data buffer 501, error detecting circuit 502, an arithmetic circuit 503 to execute an 8-bit exclusive OR logic, an input signal line (8 bits) 504, and an output signal line 505.

The operation of the conventional example will be described with reference to FIG. 6. First, a receive word read from an optical disk which has undergone a demodulation is deinterleaved and thereafter stored via the input signal line 504 into the data buffer 501. At the same time, the receive word is also delivered to the error detecting circuit 502, which effects a calculation for detecting an error, while the receive word is being received or when the input operation thereof is finished, to correct the error. If it is found that a code error exists in the receive word, the number of errors, the positions of the respective errors, and the value of the errors are determined. Thereafter, the receive word is outputted in the symbol-by-symbol fashion from the data buffer 501. In this operation, if it has been detected that a symbol delivered from the data buffer 501 has an error, the code error detecting circuit 502 outputs the value of error to the exclusive OR circuit 503. As a result, the exclusive-ORed result of the symbol delivered from the data buffer 501 and associated with an error and the value of error is outputted to the output signal line 505, thereby executing an error correction. If the encoding operation has been effected in a multiplexed fashion, the output signal line 505 is connected to a data buffer of an error detecting and correcting apparatus disposed at the subsequent stage. Furthermore, there exists also a method in which a DMA transfer of data is achieved from the data buffer 501 to a memory of a computer.

However, according to the configuration described above, in a case where data decoded by the error correcting apparatus is to be processed by the computer, the encoded data must be transferred from the data buffer of the error detecting and correcting apparatus to the memory in the host computer system. In ordinary cases, for the data transfer operation, a DMA transfer is conducted when a sector of data is completely decoded. During the DMA transfer, since the CPU in the host computer is prevented from accessing the memory, the host computer cannot achieve any job processing. Moreover, since at least a buffer of data is transferred from the data buffer of the error detecting and correcting apparatus in the DMA transfer operation, a satisfactory memory area sufficiently large to receive the data of the DMA transfer must be reserved in the computer. Furthermore, if all data of a sector is not used, there arises a problem that an unnecessary transfer time is elapsed and an unused memory area is reserved. In addition, if it is desired to directly access the data buffer of the error detecting and correcting apparatus from the host computer, since the data buffer contains information symbols, check symbols, and control codes such as a CRC at the same time, the address control for a memory access becomes complex; whereas if only the information symbols are to be successively accessed from the computer by use of data memory addresses, there arises a problem that in addition to the data buffer of the code error detecting and correcting apparatus, a separate data buffer must be disposed between the code error detecting and correcting apparatus and the computer.

SUMMARY OF THE INVENTION

It is therefore an object of the present invention to provide a code error detecting and correcting apparatus enabling a host computer to easily access data, thereby solving the problems above.

According to the apparatus of the present invention, an address change circuit or an address generate circuit handles a portion of the code words associated with the information symbols to be stored in successive addresses in a buffer. When the code error detecting and correcting circuit completely effects an error detecting and correcting operation on the code words in the buffer memory, the host computer can freely achieve a random access of the buffer memory by means of an address and data bus change-over circuit. In the buffer memory, since the check symbols and control codes are separated in the memory addresses from the information symbols necessary for the host computer, the host computer can access the buffer memory only as a memory window in which the necessary data are successively stored.

Furthermore, in an area of the buffer memory storing check codes of a block stored therein which have undergone the error correction, check symbols of another block can be written; or, when writing code words read from the buffer memory on a recording medium, check symbols of a new block can be written in an area storing check symbols which is already unnecessary. In this operation, memory areas corresponding to the same number of sectors may be respectively allocated to the control data/CRC and the information symbols, thereby preventing an overwrite operation.

Moreover, when a circuit to add an address offset is disposed between the memory space of the host computer and the buffer memory space, a physical address of the buffer memory can be converted into a logical address of the host computer.

Furthermore, when a circuit to judge an address accessed from the host computer is provided, some parts of the buffer memory can be prevented from being accessed by the host computer to write data therein or to read data therefrom.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Figure 1A:
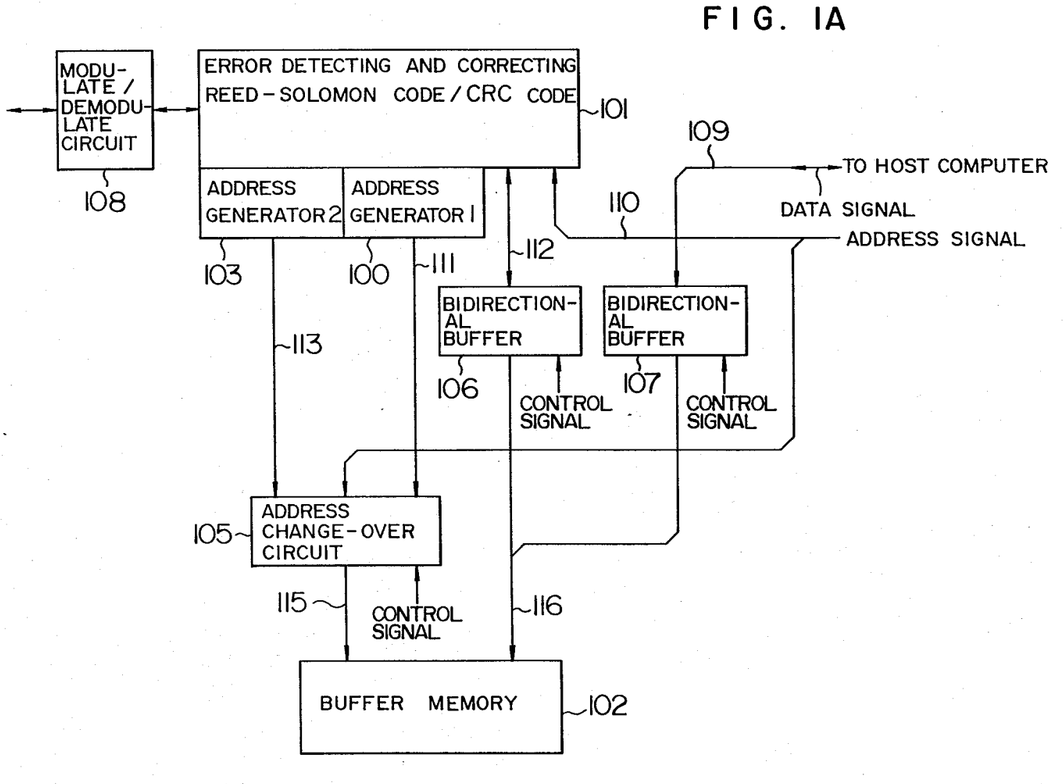
FIG. 1A is a schematic block diagram illustrating a first embodiment of the present invention.
Figure 1B:
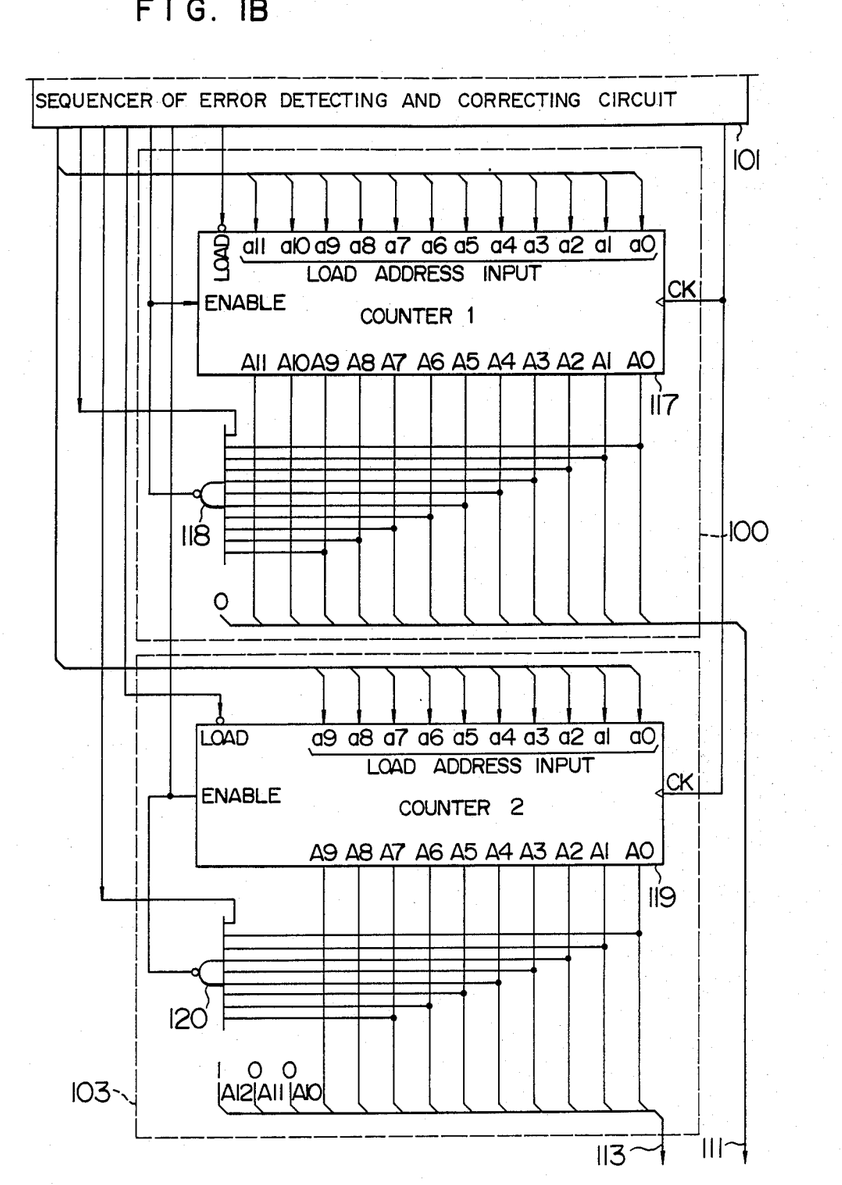
FIG. 1B is a schematic diagram showing in detail a portion of the block diagram of the first embodiment according to the present invention.
Figure 3:
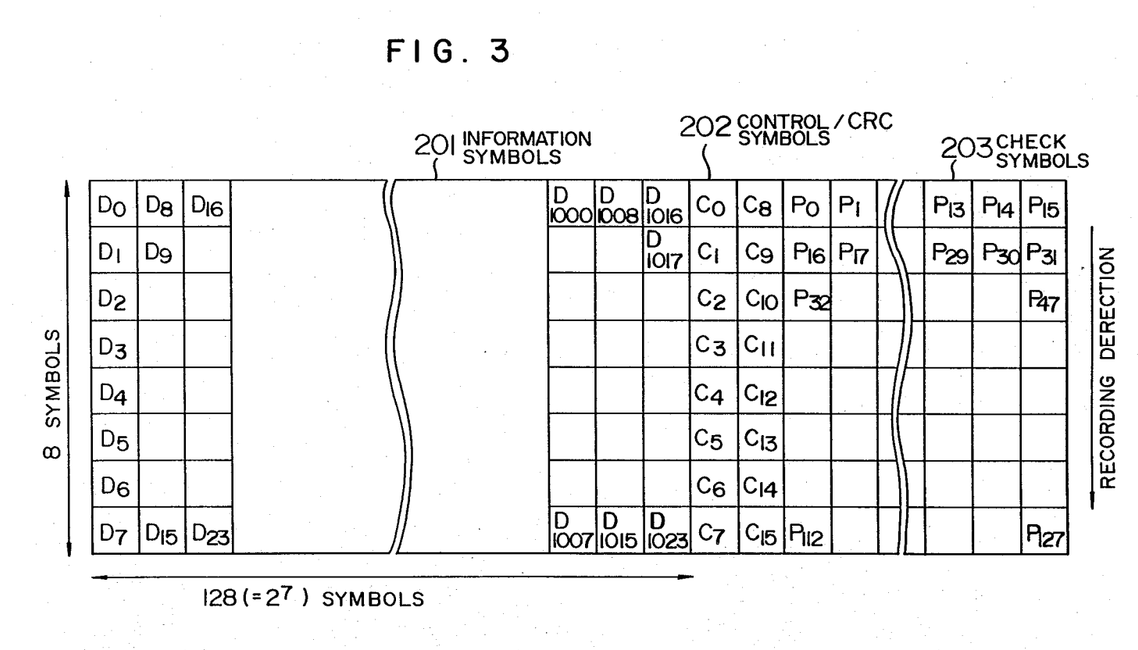
FIG. 3 is a schematic diagram showing a format in an embodiment of the present invention.
Figure 4A:
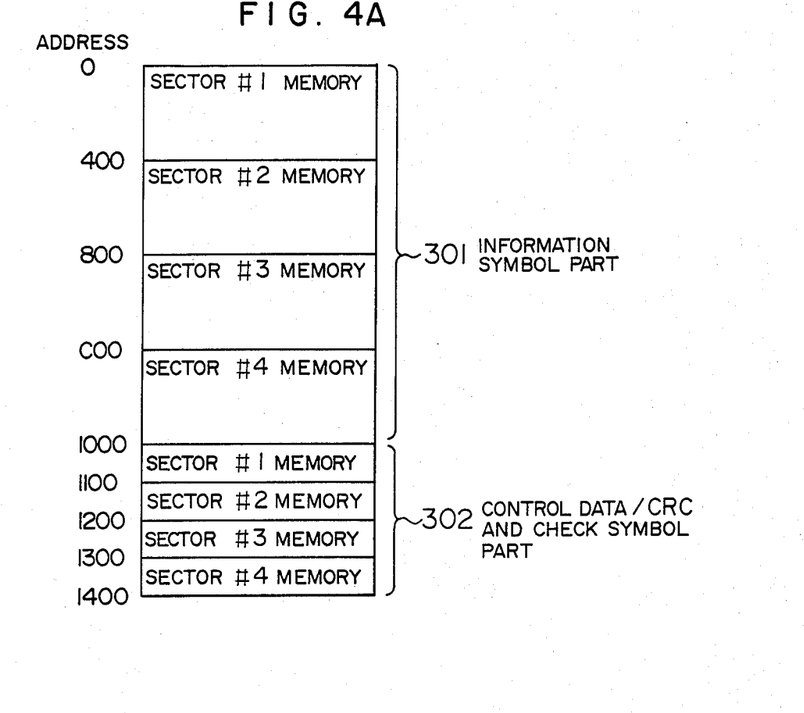
FIG. 4A is a schematic diagram depicting a memory map in the first embodiment according to the present invention.

Referring now to the drawings, a description will be given of a first embodiment of the present invention. FIG. 1A is a block diagram showing the configuration of the embodiment, FIG. 1B is a schematic diagram illustrating in detail a portion of the configuration of FIG. 1A, FIG. 3 is a format structure depicting the format of a sector, and FIG. 4 is a memory map of the buffer memory in the configuration of the first embodiment.

The system of FIG. 1A includes an error detecting and correcting circuit 101 which accesses a code word in a buffer memory 102 to check for an error. If an error is detected, the location of the detected error is accessed to effect a correction of the error symbols. Reference numeral 102 is a buffer memory in which code words of a plurality of sectors are stored. Reference numeral 100 indicates a first address generator whereas reference numeral 103 is a second address generator. When the error detecting and correcting circuit 101 access the buffer memory 102, the first address generator 100 generates an address of an information symbol part and the second address generator 103 produces addresses of a control data section and a check symbol section. Reference numeral 105 is an address change-over circuit which changes over an address bus of the buffer memory 102 to be connected to the first address generator 100, the second address generator 103, or an address line 110 of the host computer. Reference numerals 106-107 denote bidirectional buffers used to change over the data signal lines of the buffer memory 102. Reference numeral 108 indicates a modulate/demodulate circuit to write/read codes in/from an optical disk. The configuration further comprises an address signal line 109 of the host computer, a data signal line 110 of the host computer, and address signal line 111 of the first address generator 100, a data signal line 112 of the error detecting and correcting circuit 101, an address signal line 113 of the second address generator 103, and an address signal output line 115 of the address change-over circuit 105, and a data signal line 116 of the buffer memory 102. FIG. 1B is a schematic diagram illustrating in detail the first and second address generate circuits 100 and 103 of FIG. 1A in which the configuration includes a first counter 117, a first AND gate 118, a second counter 119, and a second AND gate 120. The format structure of FIG. 3 comprises an information symbol part 201, a control data/CRC part 202, and a check symbol part 203. Assume that the overall code configuration includes symbols D0 ... D7, D8 ... D15 ... D1023, C0, C1 ... C15, P0, P16 ... P127 interleaved in this sequence along the longitudinal direction. Since the formal has eight columns, a sector is constituted with eight code words. The memory map of FIG. 4A includes an information symbol part 301 and a control data and check symbol part 302. In the memory map configuration, the information symbol part 301 is separated from the control data and check symbol parts 302.

Next, the first embodiment of the present invention will be described in detail. First, receive words of sector #1 are passed through the modulator/demodulator 108 and the error detecting and correcting circuit 101 so as to be stored in the buffer memory 102. In this situation, the receive words have been interleaved and hence the code error detecting and correcting circuit 101 does not effect a calculation thereon for an error correction. As shown in FIG. 3, the receive words are first stored in the buffer memory as D0, D1, D2, ... D1023 in this order. At this point, the address change-over circuit 105 is in a state to select the output line 111 of the first address generator 100; thereafter, beginning from the portion associated with the control code 202, the change-over circuit 105 enters a state to select an address produced by the second address generator 103, which passes control to a separate address area in the memory address space. The address change-over operation will be described with reference to FIG. 1B. A sequence disposed in the code error detecting and correcting circuit 101 effects an initialization of a counter 1 of the first address generator 100 and a counter 2 of the second address generator 103 by loading 0's therein. When an input of receive words is initiated, a control is so achieved to enable only the first counter 1 of the first address generator 100. As the input of receive words proceeds, when nine low-order bits are entirely set to "1" in the output from the first address generator 100, namely, when an address of the receive word D1023 is to be outputted, the first AND circuit 118 delivers an output therefrom to the sequencer, which in turn effects a control to enable only the second counter 119. Thereafter, the second counter 119 delivers data to a separate address. FIG. 4A shows the situation by use of a memory map. In the memory areas of FIG. 4A, an information symbol part 201 of a sector is stored in the area beginning from address 0, whereas the control code part 202 and the check symbol part 203 are loaded therein beginning from an address represented 1000 (hexadecimal notation) in the memory map. Subsequently, the information symbol part 201 of the next sector is stored beginning from an address following the end of the last information symbol of the previous sector and the control code part 202 and the check symbol part 203 are also stored in a similar fashion beginning from a separate address in the memory space. Next, the code error detecting and correcting circuit 101 loads the counter 117 or 119 with an address where a code error has occurred and then accesses the code words in the buffer memory 102 to accomplish an error detection and correction. In the format of FIG. 3, since a code word comprises a vertical column, the code error detecting and correcting circuit 101 executes the error correction in the column-by-column fashion. Although the information symbol part 201 is separated from the control code and check symbol parts 202-203 in the actual addresses of the buffer memory 102, since the error detecting and correcting circuit 101 accesses the buffer memory 102 through the same address generator 100 and 103 and the same address change-over circuit 105 as those respectively used when the receive words are inputted, the address conversion is achieved by judging the address by means of the sequencer. After the operation is completed, the host computer is allowed to access the buffer memory 102. Namely, the address change-over circuit 105 selects the address signal 110 of the host computer, which enables an access from the host computer. Viewing the buffer memory 102 from the side of the host computer, only the information symbol part 301 of FIG. 4A seems to be successive in the address space and hence can be accessed according to the memory window format. That is, there is obtained an advantageous feature that the control data or check symbol part cannot be mixed in the memory address space, thereby facilitating the memory access operation.

Figure 2A:
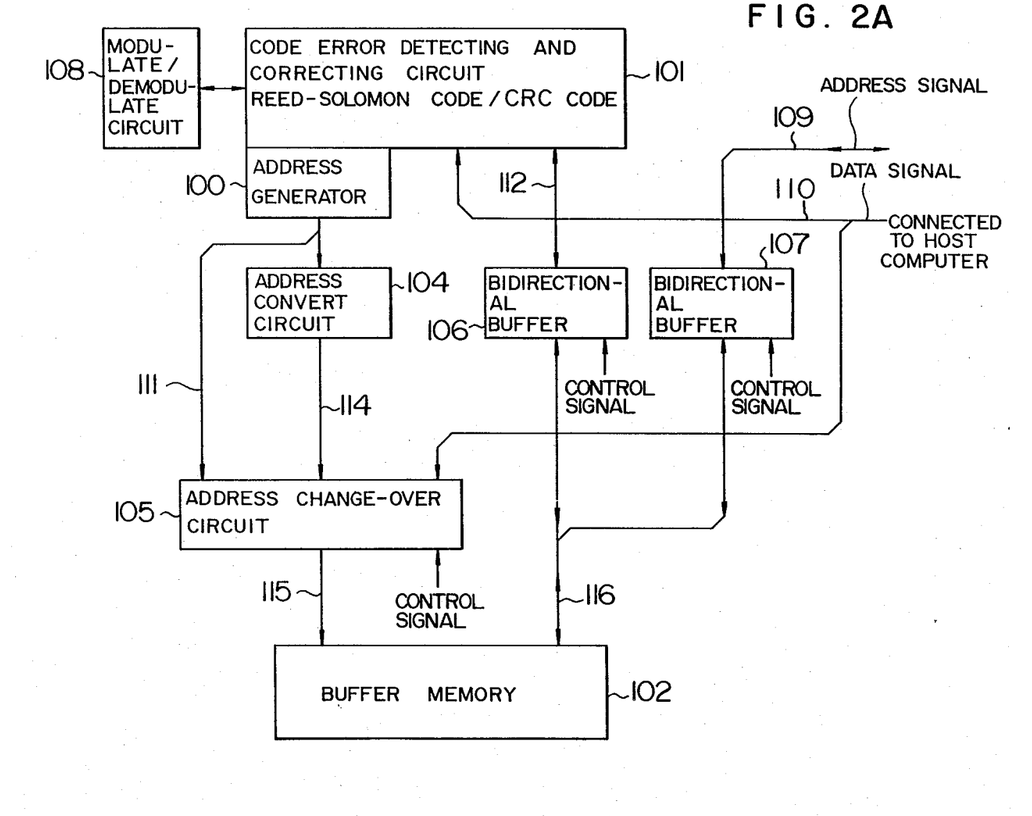
FIG. 2A is a schematic block diagram depicting a second embodiment of the present invention.
Figure 2B:
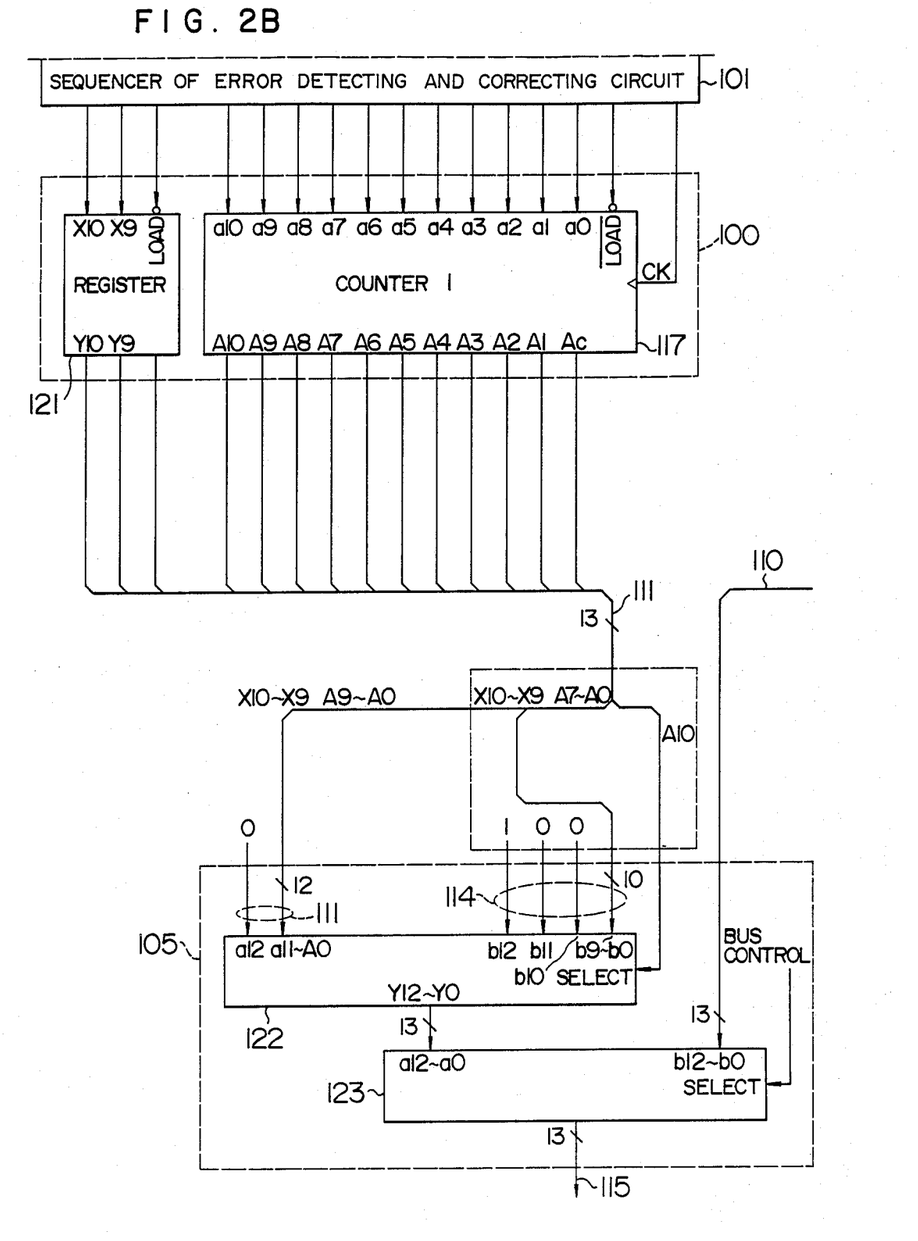
FIG. 2B is a schematic diagram illustrating in detail a portion of the block diagram of the second embodiment according to the present invention.

Next, a description will be given of the second embodiment according to the present invention. FIG. 2A in a schematic block diagram showing the configuration of the second embodiment. The format diagram of FIG. 3 and the memory map of FIG. 4A also apply to the second embodiment. The configuration of FIG. 2A comprises an address generator 100, an error detecting and correcting circuit 101, a buffer memory 102, and an address convert circuit 104 which effects a mapping operation of the control data part and the check symbol part when the error detecting and correcting circuit 101 accesses the buffer memory 102. Reference numerals 105 indicates an address change-over circuit which connects an address bass of the buffer memory 102 to an output from the address generator 100 connected to the error detecting and correcting circuit 101, the address convert circuit 104, or an address signal line 110 of the host computer. The system further includes bidirectional buffers 106-107, a modulate/demodulate circuit 108, an address signal line 109 of the host computer, a data line 110 of the host computer, an address signal line 111 of the address generator 100, a data signal line 112 of the error detecting and correcting circuit 101, an address signal line 114 of the address convert circuit 104, an address signal output line 115 of the address change-over circuit 105, and a data signal line 116 of the buffer memory 102. FIG. 2B is a schematic diagram illustrating in detail the address generator 100, the address convert circuit 104, and the address change-over circuit 105 of FIG. 2A in which the configuration comprises a first counter 117, a register 121, and an address convert circuit 104 in which the address twisting operation is executed, namely, an input selection of a selector 122 of the address change-over circuit 105 is effected by an address A10 delivered from the address generator 100, thereby achieving an address connect function. In FIG. 2B, the components basically same as those of the configuration of FIG. 1A are assigned with the same reference numerals.

Figure 4B:
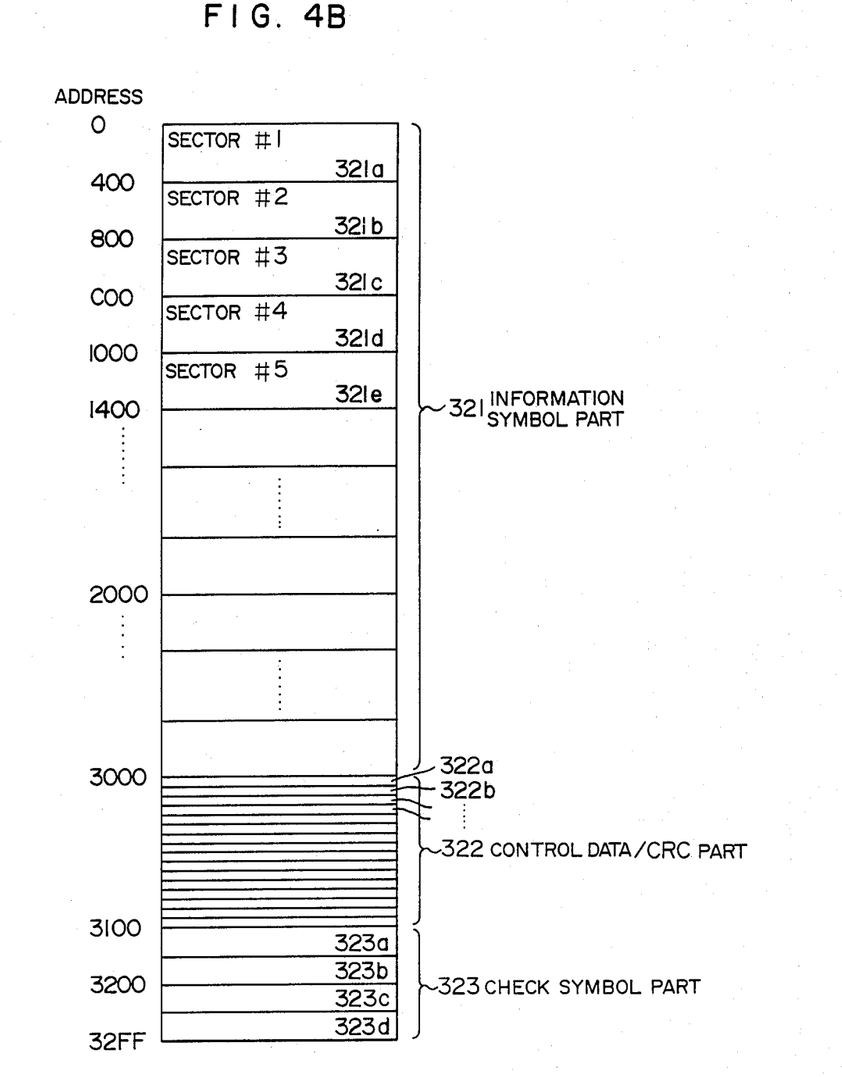
FIG. 4B is a schematic diagram illustrating a memory map in a third embodiment according to the present invention.
Figure 5:
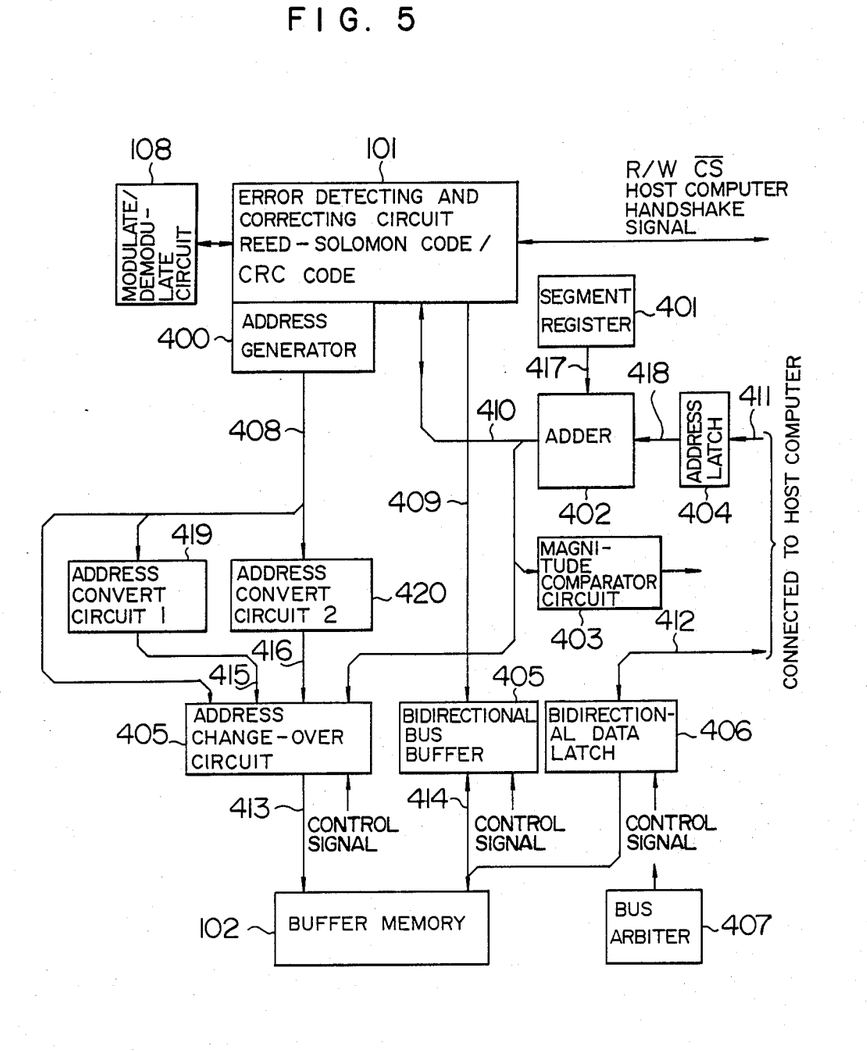
FIG. 5 is a schematic block diagram showing the third embodiment of the present invention.

Next, the operation of the second embodiment will be described. First, receive words of the first sector are fed from the modulate/demodulate circuit 108 and is stored via the error detecting and correcting circuit 101 into the buffer memory 102. Since the receive words have been interleaved in this situation, the error detecting and correcting circuit 101 does not perform a calculation for an error correction. As shown in FIG. 3, the receive words are stored in the sector buffer memory 102 as D0, D1, D2, ..., D1023 in this sequence. At this point, the address change-over circuit 105 is in a state to select the address output line 111 of the address generator 100 connected to the error detecting and correcting circuit 101; however, beginning from the portion of the control codes 202, the address signal delivered from the error detecting and correcting circuit 101 is changed by the address convert circuit 104 to generate a signal so as to use another address region. The memory map in this state is shown in FIG. 4A, which is identical to that described in conjunction with the first embodiment. Next, the code error detecting and correcting circuit 101 loads values in the counter 117 and the register 121 to access the code words in the buffer memory 102, thereby effecting the error detection and correction. Although the information codes are separated in the actual address space of the buffer memory from the control codes and the check symbols, since the error detecting and correcting circuit 101 accesses the buffer memory through the same address convert circuit 104 and the same address change-over circuit 105 as those used to input the receive words via the address generator 100, the address conversion can be automatically accomplished. When the error correction is completed, the host computer is allowed to access the buffer memory 102. That is, the address change-over circuit 105 selects the address signal of the host computer, which enables an access of the buffer memory 102 from the host computer. Ordinarily, the information symbol part includes such 512 or 1024 bytes which can be represented as a power of 2 in most cases; consequently, the address convert circuit 104 need only be structured in a very simple configuration like that of the present embodiment. Furthermore, when the recording format is set to be achieved according to an interleave of the power of 2 (for each 8 bytes) as shown in FIG. 3, the address generation for the error correction check of each code word generated by the error detecting and correcting circuit 101 can be effected only by the twisting of address lines, that is, the apparatus of the present invention can be quite simply configured by combining the address generator 100, the address convert circuit 104, and the address change-over circuit 105, which results in a high effectiveness in practical usages. Incidentally, although the control data may be dispensed with in the present embodiment, since the CRC is efficient to confirm the error correction when a sophisticated correction is achieved by use of a pointer, for example, in Read-Solomon codes, it is advisable to include the CRC system. In addition, a time-sharing configuration may be applied to the bus change-over circuit so as to change over a bus only when a change-over request is received from the host computer Next, a description will be given of a third embodiment of the present invention. FIG. 5 is a schematic block diagram showing the third embodiment according to the present invention, whereas FIG. 4B is a memory map of the buffer memory in the block diagram of FIG. 5. The configuration of FIG. 5 includes an error detecting and correcting circuit 101, a buffer memory 102, an address change-over circuit 105, and a modulate/demodulate circuit 108, which are the same as those of the first embodiment. The system further comprises an address generator 400, a first address convert circuit 419, a second address convert circuit 420, a segment register 401, and an adder 402 which adds an address signal from the host computer to an address determined by the segment register 401 to generate an access address of the buffer memory 102. Reference numeral 403 is a magnitude compare circuit disposed to determine whether or not the address determined by the address signal line of the host computer and the segment register 401 is an address which can be used to access the buffer memory 102. Reference numeral 404 is an address latch to latch an address delivered from the host computer. The configuration further includes a bidirectional bus buffer 405, a bidirectional data latch 406, a bus arbiter 407 to arbitrate the usage of the bus, an address signal line 408 of the error detecting and correcting circuit 101, a data signal line 409 thereof, and a physical address signal line 410 which delivers an output from the adder 402. The physical output address is different from the address 411 to be accessed from the host computer. Moreover, the configuration includes an address signal line 411 of the host computer, a data signal line 412 thereof, an address signal line 413 of the buffer memory 102, a data signal line 414 thereof, an output address 415 from the first address convert circuit 419, an output address 416 from the second address convert circuit 420, a register value output signal line 417 from the segment register 401, and an output address 418 from the address latch 404. The memory map of FIG. 4B comprises an information symbol part 321, a control data part 322, and a check symbol part 323. Moreover, the memory map comprises information symbols 321a-321e of sectors #1-#5, respectively; control data 322a-322b of sectors #1-#2, respectively; and check symbols 323a-323d of sectors #1-#4, respectively. In the memory map, the information symbol part 321 is separated from the control data part 322 and the check symbol part 323.

Next, the operation of the third embodiment will be described. In this embodiment, when data is written from the host computer into the buffer memory 102, the address and data on the host computer bus are temporarily kept in the address latch 404 and the data latch 406. In a read operation, on the other hand, only the address of the host computer is written in the address latch 404. During a clock cycle in which the address generator 400 connected to the error detecting and correcting circuit 101 and the circuit 101 is not accessing the buffer memory 102, the data latched in the data latch 406 is read so as to be passed to the host computer, thereby executing an access. The adjustment of timing is achieved by the arbiter 407. When data is read from the buffer memory 102 into the host computer, the bus arbiter 407 allows a read operation on the buffer memory 102 so as to satisfy the timing of the access time of the host computer. If the timing cannot be satisfied, a wait cycle must be inserted. Furthermore, according to the present invention, to an address signal 411 supplied from the host computer, a segment address determined by the segment register 401 is added by the adder 402 to generate an address for the access; consequently, a physical address in the buffer memory 102 can be converted into a logical address of the host computer. Moreover, since the magnitude compare circuit 403 monitors an access address of the host computer, when a memory area other than the information symbols in the sector for which an error detection and correction is completed and an access is allowed is attempted to be accessed by mistake, the error of access can be detected and hence is inhibited. This enables a reduction in the load on the memory control of the host computer Furthermore, in the present embodiment, the information symbols are stored in the area 321a of the memory map of FIG. 4B. The mapping is achieved by means of the address generator 400 and the address convert circuits 419-420. Since the actual circuits can be implemented in the similar fashion associated with the circuits of FIG. 2B, a detailed description will be omitted. When the operation proceeds to the control data/CRC following the information symbols, namely, the part of C0, C1, . . . , C15 of FIG. 3, the input to the address change-over circuit 405 is set to select the output from the first address convert circuit 419. As a consequence, the control data/CRC is mapped by the address convert circuit 419 so as to be stored in the area 322a of FIG. 4B. For the portion to be finally read out, namely, the part of check symbols P0, P16, P32, . . . , P127, the address change-over circuit 405 is set to output the signal from the second address convert circuit 420, and hence the check symbols are mapped and are stored in the area 323a of FIG. 4B. With this step, the read operation on the first sector is completed and the processing proceeds to sector #2. For the sector #2, the control data is mapped onto the area 322b, whereas the check symbols are mapped onto the area 323b. At the same time when data of a sector subsequent to the second sector is read and is stored in the buffer memory 102, the error detecting and correcting circuit 101 effect a cycle steal by means of the bus arbiter 407 to access the buffer memory 102, thereby effecting an error correction on a sector beforehand read out. When the sector #5 is subjected to the sector read operation, the check symbols 203 of FIG. 3 are written in the area 323a in which the check codes of the sector #1 have been written. In this operation, if the correction of the error detecting and correcting circuit 101 is completed in a sufficiently short period of time, the error correction of the sector #1 must have already been finished, the check symbols are unnecessary and hence there arises no problem even if the new data is overwritten in the area containing the check symbols. However, also in this case, the control data 202 must be kept; consequently, there are reserved as many control data/CRC parts 322 of FIG. 4B as there are information symbol parts 321 corresponding to the respective sectors, thereby preventing a problem of insufficient control data. As described above, according to the present example, by using the check symbol part ranging from 323a to 323d, the information symbols of up to 15 sectors can be stored in the information symbol part 321. Furthermore, since the areas of the check symbols that have become unnecessary are sequentially overwritten in the memory so as to read data from an optical disk, the volume of memory utilized can be minimized. Also in this case, the control data/CRC remains in the memory.

When writing data on an optical disk, the host computer first writes data in the information symbol part 321 of the buffer memory 102; thereafter, when the control data 322 is completely written, the error detecting and correcting circuit 101 need only add the check symbols 323 thereto. In this operation, if the sector having the check codes added thereto are sequentially written on the optical disk in concurrence with the generation of the check codes, the check symbols of the sectors which have been completely written on the optical disk become unnecessary; consequently, the memory areas of the check symbols need not be prepared for all the sectors. Furthermore, the information symbols of the CRC may be generated such that the error detecting and correcting circuit 101 disconnects the bus of the host computer, after the information words from the host computer are written in the buffer memory 102, and then reads data from the buffer memory 102. The error detecting and correcting circuit 101 generates CRC symbols in the control codes and locates the result in the area 322 by use. of the first address convert circuit 419; thereafter, the buffer memory 102 is read again to generate the check symbols. Alternatively, when the error detecting and correcting circuit 101 completes the error detection and correction based on the check symbols, the check using the CRC arranged in the control codes may be achieved by reading again the buffer memory 102, and then the bus of the host computer is connected to the apparatus according to the present invention so that the host computer reads from the buffer memory 102 the information words which have undergone the error correction.

As described above, according to the present invention, since the buffer memory 102 of the code error detecting and correcting apparatus can be directly accessed from the host computer, the DMA transfer of data from the code error detecting and correcting apparatus to the memory of the host computer is not necessary. Furthermore, of the code words, the control codes and the check symbols are separated from the information symbols in the address space of the buffer memory, namely, the control codes and the check codes can be successively located in a plurality of blocks, which enables the host computer to reference the information symbol part as collected data according to the memory window format. As a consequence, the interface between the error detecting and correcting apparatus and the host computer is quite simplified and hence the load imposed on the host computer is lowered. Moreover, since the check symbol part is duplicatedly used, the amount of necessary buffer memory is minimized. Also,in this situation, the control data/CRC can be retained in the memory for all sectors including the information symbol parts and hence can be referenced at any time after the decode operation is finished. When recording data on a recording medium, the CRC has an effect to confirm whether or not the data transfer between the host computer and the code error detecting and correcting apparatus has been completely achieved, in other words, the control data can be regarded as information symbols. In this regard, it is quite convenient that the CRC of each sector is mapped onto a part of the memory without causing an overlap therebetween. Furthermore, a physical address of the buffer memory can be converted into a logical address of the host computer and when a memory area for which an access is inhibited is attempted to be accessed, the error is detected to prevent the memory access; consequently, the load of memory control imposed on the host computer can be reduced.

While the present invention has been described with reference to the particular illustrative embodiments, it is not restricted by those embodiments but only by the appended claims. It is to be appreciated that those skilled in the art can change and modify the embodiments without departing from the scope and spirit of the invention.

We claim:

1. A code error detecting and correcting apparatus using a block constituted with p code words of error detection and correction codes each including m symbols of information symbols; n symbols of control codes, and k symbols of check symbols added to the information symbols and the control codes, said apparatus comprising:

a buffer memory for temporarily storing the code words;

a code error detecting and correcting circuit which accesses said buffer memory to generate the check symbols and adds them to the information symbols and the control codes for effecting an error correction on the code words;

means for reading the code words from said buffer memory to write the code words in a recording medium or for reading code words from the recording medium to write the code words in said buffer memory;

means for writing information words in said buffer memory on the basis of addresses instructed by a host computer or for reading information words which have undergone error correction from said buffer memory on the basis of addresses instructed by the host computer;

write/read means operative, at an access to said buffer memory by said code error detecting and correcting circuit to execute a check symbol generation or a detection and correction operation, for writing in or reading from an area of said buffer memory control codes and check symbols of a code word to processed in the block, said area being located at an address space which is separated from an address space associated with the information symbols; and a bus switch circuit for switching an address bus and a data bus from said code error detecting and correcting circuit and a host computer address bus and a host computer data bus from said host computer to said buffer memory for establishing address and data paths between said buffer memory and either said code error detecting and correcting circuit or said host computer wherein a plurality of consecutive blocks of information symbols in said buffer memory are allocated to a memory space of the host computer, thereby enabling the communication of information between said host computer and buffer memory.

2. An apparatus according to claim 1 where in said write/read means is activated by supplying a linear address generated in said code error detecting and correcting circuit via an address convert circuit to said buffer memory, said apparatus further comprising;

means for recognizing a block which has undergone error detection and correction or a block completely written in the recording medium whereby:

when code words are read from the recording medium so as to be written in said buffer memory, said address convert circuit sets at least a part of store addresses of the code words of a new block to be overlapped with store addresses of the control codes or the check symbols of the code words of a block which has already undergone error detection and correction, thereby converting the store addresses and when code words are read from aid buffer memory so as to be written on the recording medium, said address convert circuit sets store addresses of information symbols, control codes, and check symbols of a new block to be written from the host computer into said buffer memory to be overlapped with a part or all of store addresses of the codes of a block already written on the recording medium and regarded as unnecessary, thereby converting the store address.

3. An apparatus according to claim 2 wherein said address convert circuit allocates store addresses of the information symbols in said buffer memory to a first memory area which is regarded as consecutive at least from the host computer side, converts store addresses of the control codes into addresses in a second memory space in said buffer memory, said space not being overlapped with another area, and converts store addresses of the check symbols into addresses of a third area in said buffer memory whereby when code words are read from the recording medium so as to be stored in said buffer memory, said address convert circuit writes check symbols of a new block in a third area in which check symbols of a block already stored and which has undergone an error correction have been stored and when code words are read from said buffer memory so as to be written on the recording medium, said address convert circuit writes check symbols of a new block in a third area in which check symbols already written and being obsoleted have been stored.

4. An apparatus according to claim 3 wherein said error detecting and correcting circuit includes means operative after the information words from the host computer side are written in said buffer memory for reading said buffer memory, for generating and arranging CRC check systems in the control codes, and for reading thereafter again said buffer memory to generate the check symbols, or when an error detection and correction using said check symbols is completed, said means reading again said buffer memory to effect a check using CRC check symbols and then causing the host computer side to read from said buffer memory the information words which have undergone error correction.

5. An apparatus according to claim 1 further including an address offset adding circuit between the memory space of the host computer and said buffer memory for converting a physical addresses of said buffer memory into a logical address of the computer.

6. An apparatus according to claim 1 further including a circuit for determining whether a part of said buffer memory to which the host computer seeks access is accessable and, if not, for inhibiting a write operation or a read operation from the host computer side in said part of said buffer memory.

* * * * *